(12) United States Patent
Rothkopf et al.

(10) Patent No.: US 8,111,522 B2
(45) Date of Patent: Feb. 7, 2012

(54) SWITCH STRUCTURES FOR USE ON PRINTED CIRCUIT BOARDS

(75) Inventors: Fletcher R. Rothkopf, Mountain View, CA (US); Teodor Dabov, San Francisco, CA (US); Richard Hung Minh Dinh, San Jose, CA (US); Jun Sun, Cupertino, CA (US); Michael Rosenblatt, Campbell, CA (US)

(73) Assignee: Apple Inc., Cupertino, CA (US)

( * ) Notice: Subject to any disclaimer, the term of this patent is extended or adjusted under 35 U.S.C. 154(b) by 953 days.

(21) Appl. No.: 12/150,684

(22) Filed: Apr. 29, 2008

(65) Prior Publication Data

US 2009/0266699 A1  Oct. 29, 2009

(51) Int. Cl.
*H05K 7/02* (2006.01)
*A01H 9/18* (2006.01)

(52) U.S. Cl. ........................ 361/781; 200/314
(58) Field of Classification Search .............. 361/760, 361/781, 782, 752, 790; 200/341
See application file for complete search history.

(56) References Cited

U.S. PATENT DOCUMENTS

| 4,680,432 | A | * | 7/1987 | Sugiyama et al. | 200/5 A |
| 5,613,861 | A | * | 3/1997 | Smith et al. | 439/81 |
| 5,950,808 | A | * | 9/1999 | Tanabe et al. | 200/314 |
| 2004/0159535 | A1 | * | 8/2004 | Wagner | 200/512 |
| 2004/0264150 | A1 | * | 12/2004 | Tsugui et al. | 361/760 |
| 2006/0131153 | A1 | * | 6/2006 | Asada | 200/341 |
| 2009/0090607 | A1 | * | 4/2009 | Ichikawa et al. | 200/341 |
| 2010/0012473 | A1 | * | 1/2010 | Zieder | 200/341 |

* cited by examiner

*Primary Examiner* — Hien Vu
(74) *Attorney, Agent, or Firm* — Ropes & Gray LLP

(57) ABSTRACT

An electrical contact area on a printed circuit board ("PCB"), that would otherwise be subject to abrasion and possibly also corrosion, can be protected by covering it with another, more durable contact structure that is bonded to the first-mentioned contact area using an anistropic conductive adhesive ("ACA"). The more durable contact structure may include a member of PCB material or the like with electrically connected electrical contacts on its upper and lower surfaces. At least the upper one of these contacts (which is exposed for the service that involves possible abrasion and/or corrosion) may be given high durability by plating it with hard gold. The lower of these contacts is adhered to the main PCB via the above-mentioned ACA.

27 Claims, 5 Drawing Sheets

US 8,111,522 B2

SWITCH STRUCTURES FOR USE ON PRINTED CIRCUIT BOARDS

BACKGROUND OF THE INVENTION

This invention relates to printed circuit boards, and more particularly to structures that can be used on printed circuit boards ("PCBs") to facilitate the provision of electrical switches on such boards.

PCBs are frequently constructed so that they can include one or more manually operable electrical switches. An example of such a switch is a so-called dome switch. A dome switch typically includes a circular metal disc that is resiliently biased to form a small dome above a surface of the PCB. The circular outer edge of the disc bears on a ring-shaped outer contact on the surface of the PCB. Another contact (the inner contact) is inside the outer contact on the PCB surface and under the center of (but not normally in contact with) the above-mentioned metal disc. The inner contact is spaced from all parts of the outer contact. The inner contact is therefore not normally in electrical contact with the outer contact. However, the center of the above-mentioned dome can be manually pressed down into contact with the inner contact, thereby forming an electrical connection between the inner and outer contacts and electrically "closing" the switch. When the manual pressure on the dome is released, the metal disc resiliently returns to its "relaxed" dome shape. This moves the center of the dome out of contact with the inner contact and electrically "opens" the switch.

Switches with a moving part or parts (e.g., dome switches) unavoidably subject PCB contacts like those mentioned above to abrasion each time the switch is operated. Some switches (like dome switches) may also need to be "vented" for proper operation. This exposes the PCB contacts to the possibility of corrosion.

To give switches adequate service life, it is typically necessary to plate the PCB contacts with so-called "hard gold." Hard gold is an alloy of gold and nickel and/or cobalt. Hard gold plating can be expensive and/or difficult when an entire PCB must be subjected to such processing.

SUMMARY OF THE INVENTION

In accordance with certain possible aspects of the invention, a PCB structure may include a main board including first and second contact areas, a secondary board including first and second contacts that are coated with hard gold, and anisotropic conductive adhesive for electrically and mechanically coupling the contacts to the contact areas and for sealing the contact areas.

In accordance with certain other possible aspects of the invention, a PCB structure may include a main PCB structure having an electrical contact area on one of its main surfaces, a secondary PCB structure having first and second electrically connected electrical contacts disposed, respectively, on its two main surfaces, and anistropic conductive adhesive ("ACA") for physically and electrically connecting the second contact and the contact area. The contact area does not need to be abrasion or corrosion resistant because it is covered by the ACA and the secondary PCB structure. The contact area can therefore have only an immersion gold covering, which is relatively easy to apply (although it is not particularly abrasion or corrosion resistant). Only the contacts on the secondary PCB structure (especially the more exposed first contact) need such abrasion and/or corrosion resistance (e.g., by being plated with hard gold). However, such hard gold plating is easier and cheaper to perform on the secondary PCB structure than on the main PCB structure because the secondary structure can be smaller and simpler than the main structure, and because the secondary structure can be fabricated separately from the main structure prior to being joined to the main structure by the ACA.

Further features of the invention, its nature and various advantages, will be more apparent from the accompanying drawings and the following detailed description.

DETAILED DESCRIPTION

Figure 1:
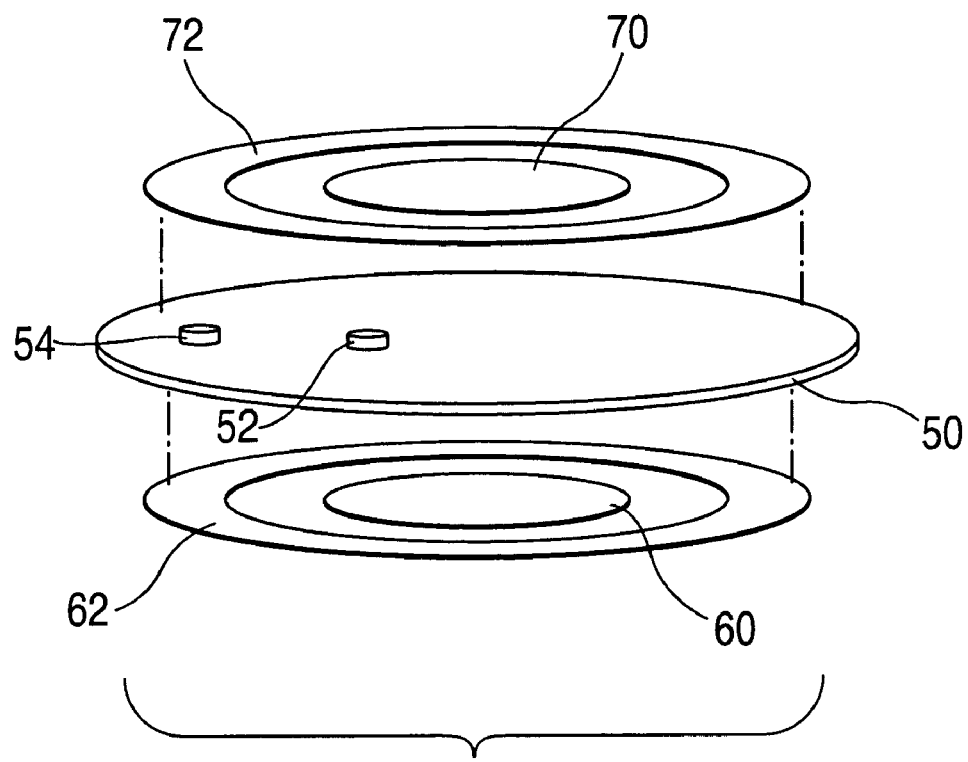
FIG. 1 is a simplified, exploded, perspective view of an illustrative embodiment of a structure in accordance with the invention.
Figure 2:
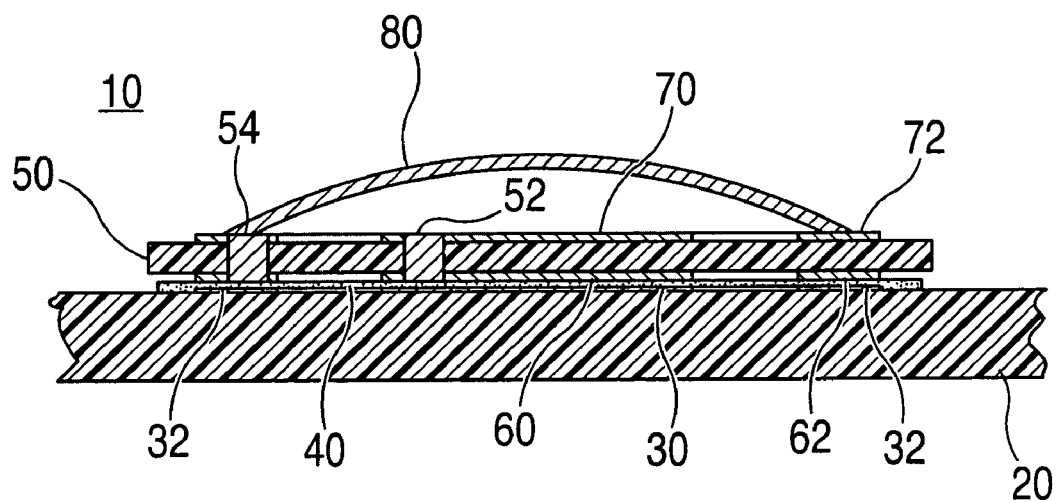
FIG. 2 is a simplified sectional view of an illustrative embodiment of a structure in accordance with the invention.

A cross section of an illustrative embodiment of a dome switch 10 in accordance with the invention is shown in FIG. 2, and several components of switch 10 are shown in an exploded perspective view in FIG. 1. Dome switch 10 is mounted on one of the two main or primary planar surfaces of main PCB 20, which can be conventional and which can extend away from dome switch 10 to include (or at least support and interconnect) any desired amounts and kinds of other circuitry.

As shown in FIG. 2, the structure of dome switch 10 includes a circular inner contact 30 deposited on the upper main surface of PCB 20. For example, contact 30 may be formed from PCB electrical circuit trace material coated with immersion gold. Inner contact 30 is surrounded by ring-shaped outer contact 32, which is also deposited on the upper main surface of PCB 20 with some spacing or separation from all parts of inner contact 30. There is therefore normally no electrical connection between contacts 30 and 32. Contact 32 may be formed in the same way as contact 30 (e.g., from PCB trace material coated with immersion gold).

Contacts 30 and 32 are covered by a layer of anistropic conductive adhesive ("ACA") 40. This is a material that is electrically conductive across its short dimension (the vertical dimension in FIG. 2), but is not electrically conductive in other directions (e.g., the horizontal direction as viewed in FIG. 2). Thus, although ACA makes good electrical connections (vertically) to each of contacts 30 and 32, it does not (by itself) provide an electrical connection between those contacts. ACA 40 is also (as its name implies) a good adhesive. It therefore provides a protective seal over contacts 30 and 32 to prevent corrosion of the immersion gold coating on those contacts. ACA 40 can be provided in the form of a film (known as anistropic conductive film or ACF). ACA and ACF are well known to those skilled in the art, and can be per se conventional.

Above ACA 40 is an assembly of components 50, 52, 54, 60, 62, 70, and 72. This assembly is typically applied to the structure below as a pre-fabricated unit. The components of this unit are (1) a small, circular disc 50 of rigid PCB or flexible printed circuit ("FPC") material, (2) a lower inner contact 60 formed on the lower main surface of disc 50, (3) a lower outer contact 62 also formed on the lower main surface of disc 50, (4) an upper inner contact 70 formed on the upper main surface of disc 50, (5) an upper outer contact 72 also formed on the upper main surface of disc 50, (6) an inner via 52 through disc 50 for electrically connecting upper and lower inner contacts 60 and 70, and (7) an outer via 54 through disc 50 for electrically connecting upper and lower outer contacts 62 and 72. Each of inner contacts 60 and 70 is at or near the center of disc 50, and each is typically circular. (As a general matter, FPC is included within the term PCB as the latter term is used herein.) Each of outer contacts 62 and 72 is typically ring-shaped and spaced radially outwardly from the associated inner contact 60 or 70. More particularly, each of outer contacts 62 and 72 typically concentrically surrounds (but does not touch) the associated inner contact 60 or 70.

Each of contacts 60, 62, 70, and 72 may be plated with hard gold. This can be done relatively easily and inexpensively because the assembly of elements 50, 52, 54, 60, 62, 70, and 72 is relatively small and, at least while being fabricated as a separate unit or subassembly, is separate from PCB 20 and any other circuitry on PCB 20. Only after this subassembly has been completely fabricated is it applied, as a unit, to PCB 20 by pressing it down on top of ACA 40.

ACA 40 acts as an adhesive to hold the above-mentioned subassembly of elements 50-72 to the other structure on PCB 20. In addition, ACA 40 provides an electrical connection between contacts 30 and 60, and another (electrically separate) electrical connection between contacts 32 and 62.

The last element of dome switch 10 is metal dome 80, which can be per se conventional and which is disposed above disc 50 and the contacts 70 and 72 on the upper surface of that disc. As is per se conventional, dome 80 is typically a circular metal disc. The circular outer edge (periphery or base) of this disc bears on and therefore makes electrical contact with upper outer contact 72. This physical and electrical contact between elements 72 and 80 typically extends annularly all the way around both of these elements.

FIG. 2 shows dome 80 in its relaxed state, in which the center of the dome arches up over and out of physical and electrical contact with upper center contact 70. There is therefore no electrical connection between contacts 70 and 72, and switch 10 is accordingly electrically "open". However, when downward pressure is applied to the center of dome 80 (e.g., by a user manually pressing down on the dome), the center of the dome can move down into physical and electrical contact with upper inner contact 70. Dome 80 then completes an electrical circuit between contacts 70 and 72, which electrically "closes" switch 10. A closed electrical circuit is thus formed through an electrical series of the following elements: 30, 40, 60, 52, 70, 80, 72, 54, 62, 40, and 32.

When the above-mentioned downward pressure on dome 80 is removed, dome 80 resiliently returns to the condition shown in FIG. 2, thereby breaking the electrical connection through switch 10 and electrically "reopening" the switch.

From the foregoing it will be seen that the invention avoids the need for plating hard gold on main PCB 20. Only immersion gold is needed on the main PCB (i.e., on contact areas 30 and 32). This immersion gold is not subjected to abrasion by operation of the dome switch, and it is also protected from corrosion by being covered by ACA 40. Hard gold (e.g., on contacts 60, 62, 70, and 72) can be used only on much smaller and simpler "mini" or secondary PCB 50. This mini PCB can be completely fabricated as a separate item before it is added to (i.e., physically and electrically connected to) the structure on main PCB 20 via ACA 40. The above-mentioned separate fabrication of mini PCB 50 can include all required plating of hard gold on the mini PCB structure. The dome 80 of dome switch 10 physically contacts only the hard gold on mini PCB 50.

Figure 3:
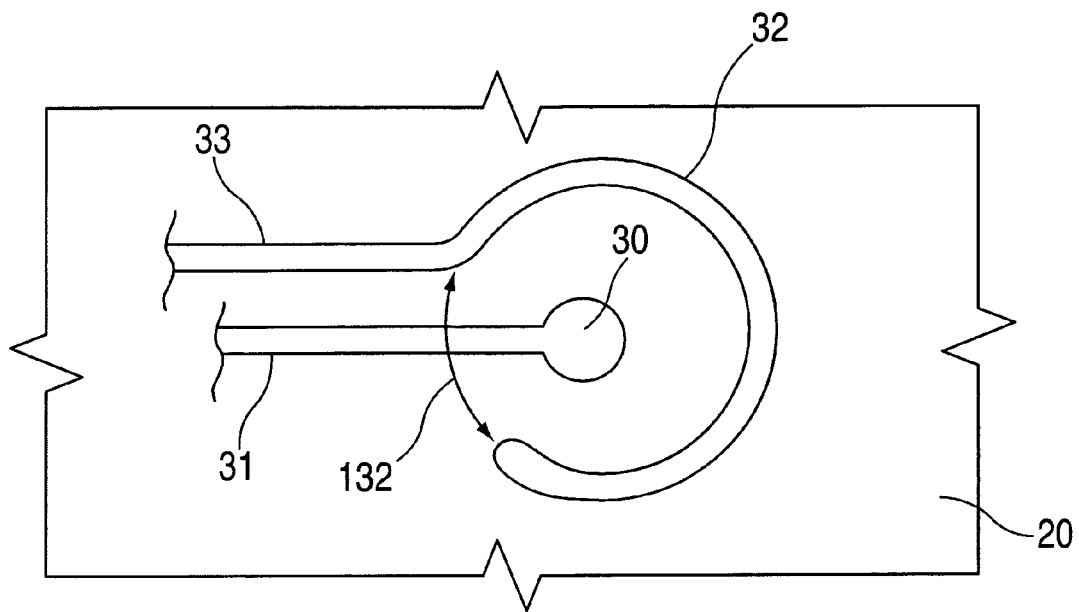
FIG. 3 is a simplified plan view of an illustrative embodiment of another possible structure in accordance with the invention.

Another possible (optional) aspect of the invention is illustrated by FIG. 3 and some of the subsequent FIGS. FIG. 3 shows the "top" main surface of main PCB 20 with no secondary PCB structure yet in place. FIG. 3 shows electrical contact 32 having a C shape (rather than a closed ring shape as in FIG. 2). Contact 30 is at or near the center of this C shape. The PCB circuit trace 31 leading to contact 30 and the PCB circuit trace 33 leading to contact 32 are both on the same main surface of PCB 20. This is possible because trace 31 is able to reach inner contact 30 through the open side of the C shape of outer contact 32. This open side of the C is indicated by double-headed arrow 132.

To prevent the secondary PCB structure and dome (like elements 50-80 in FIGS. 1 and 2) from short-circuiting elements 30/31 and 32/33 when the secondary PCB structure is placed over PCB 20 in FIG. 3, elements 50-80 are partly reshaped for this embodiment as will now be described.

Figure 4:
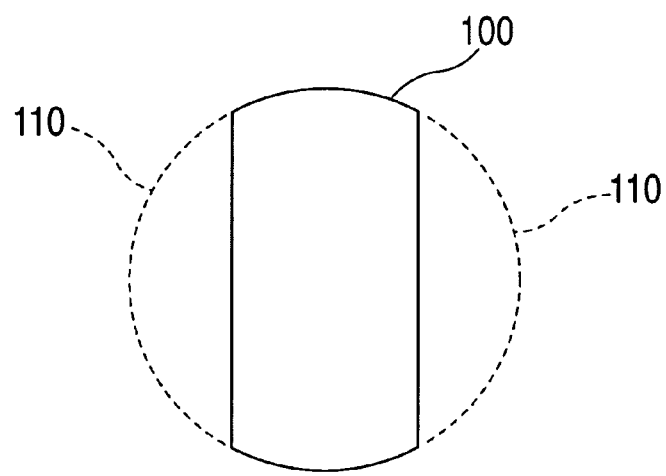
FIG. 4 is a simplified plan view diagram that is useful in explaining certain possible aspects of the invention.

FIG. 4 shows that in this embodiment all of elements 50-80 (renumbered 50'-80' in subsequent FIGS.) are reshaped by cutting away the portions of any of these elements that would otherwise extend beyond solid line perimeter 100 (to dotted line perimeter portions 110).

Figure 5:
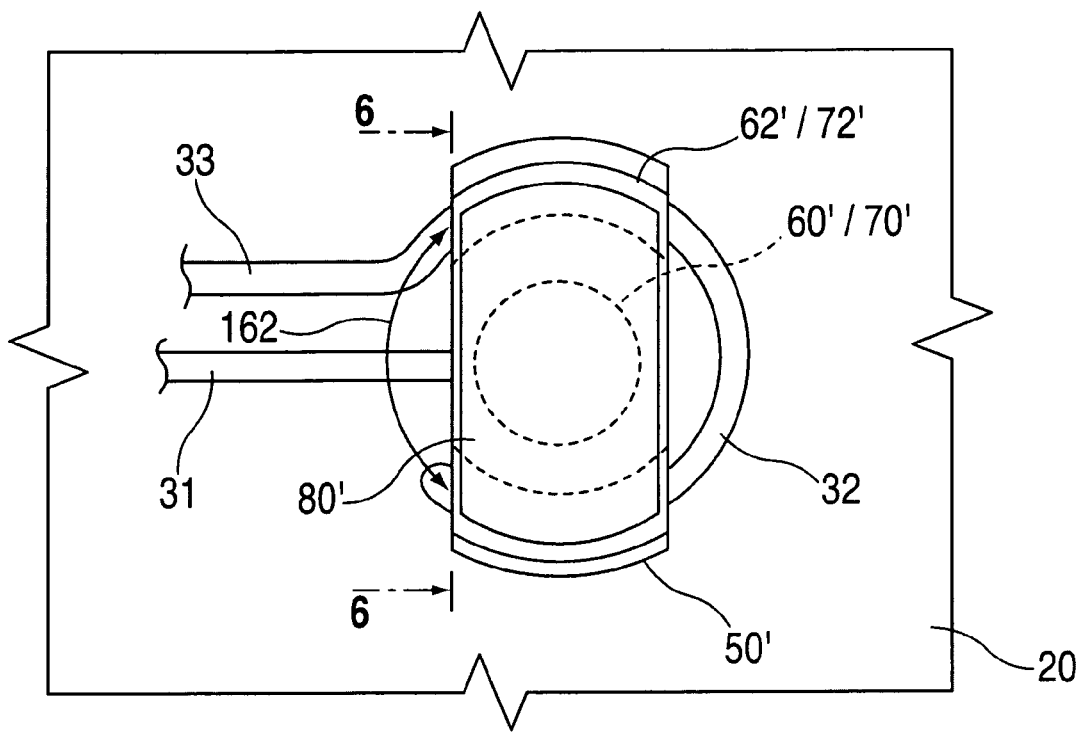
FIG. 5 is a simplified plan view showing an illustrative embodiment of additional apparatus added to what is shown in FIG. 3 in accordance with the invention.

FIG. 5 shows secondary PCB structure 50'-80' mounted on the upper surface of PCB 20 from FIG. 3. The type of mounting used in FIG. 5 may be the same as that shown in FIG. 2 (i.e., ACA between contacts 30 and 32 on PCB 20 and contacts 60' and 62' on secondary PCB structure 50'-80'). FIG. 5 shows most of the structure of elements 50'-80' in full or phantom lines, but to avoid confusion it completely omits the portions of what is shown in FIG. 3 that are out of sight beneath assembly 50'-80'. As can be seen in FIG. 5, secondary PCB 50' becomes elongated rather than circular. Contacts 60' and 70' remain full circular shapes. However, contacts 62' and 72' each become two interrupted arcuate segments. Dome 80' becomes only a transverse section of a full circular dome. In particular, dome 80' may be somewhat more like an arch (see FIG. 6, which is a side view, taken along the line 6-6 in FIG. 5, of only the elements of secondary PCB structure 50'-80'). The center of this arch 80' can, of course, be pressed down to touch contact 70' when it is desired to electrically close the switch.

It will be appreciated that the above-described construction of secondary PCB structure 50'-80' prevents any part of structure 50'-80' from causing a short circuit between traces 31 and 33, both of which are on the same side of PCB 20 as structure 50'-80'. Among the advantages of being able to put both of traces 31 and 33 on the same side of PCB 20 are use of less board space and prototyping efficiency (i.e., facilitating changes of design without changing board 20).

Recapitulating some aspects of the above description of FIGS. 3-6 in somewhat different terms, FIG. 3 shows that contact area 32 is interrupted (at 132) so that it does not completely surround contact area 30. The conductive trace 31 to contact area 30 is therefore able to reach that contact area on the same side of PCB 20 as features 32 and 33 by passing through this interruption 132. Contact 62' on the lower surface of secondary PCB 50' is similarly interrupted (at 162) so that it does not completely surround contact area 60. Structure 50'-80' is assembled on main PCB 20 so that interruption 162 registers with interruption 132. This prevents contact 62' from causing a short circuit between traces 31 and 33.

Figure 6:
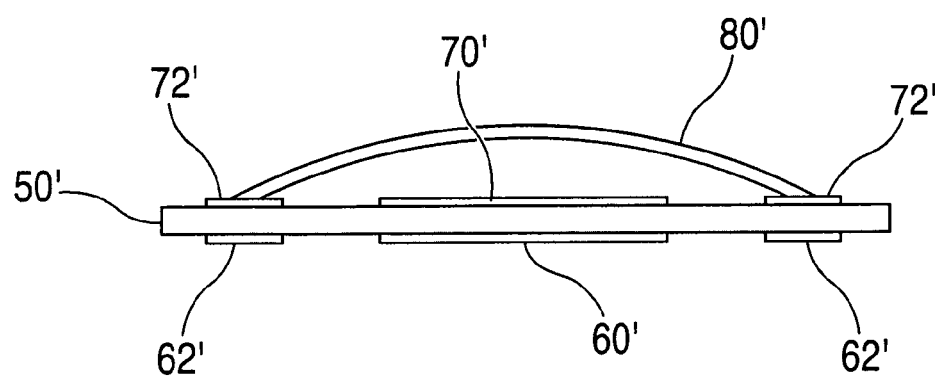
FIG. 6 is a simplified, partial, elevational view taken along the line 6-6 in FIG. 5.
Figure 7:
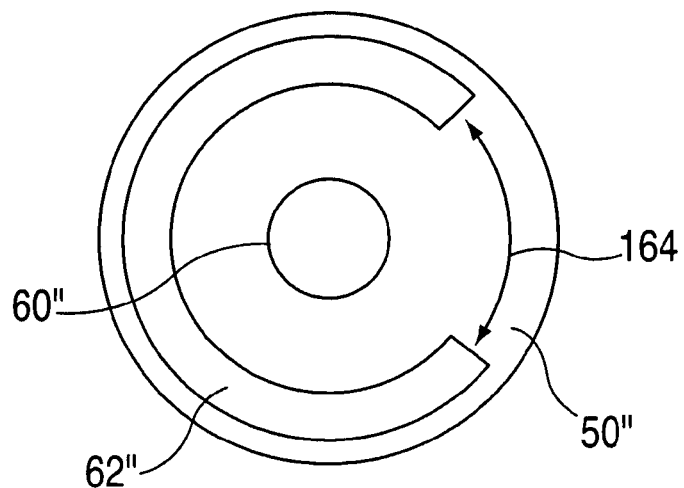
FIG. 7 is a simplified bottom plan view of an illustrative embodiment of another possible structure in accordance with the invention.

It may be desired to use a construction for main PCB 20 like that shown in FIG. 3 without having to resort to an arch switch (e.g., as shown in FIGS. 4-6), rather than a full dome switch. FIG. 7 shows an illustrative embodiment of a secondary PCB structure that can be used in such a case.

FIG. 7 shows the under-side of a secondary PCB structure 50". This side of the secondary PCB structure has central contact area 60" partly surrounded (at some radial distance or spacing) by C-shaped contact area 62". The open side of C-shaped contact 62" is indicated by the double-headed, arcuate arrow 164. Except for contacts 60" and 62", the depicted lower main surface of secondary PCB material or sheet 50" is, of course, electrically insulating (because material 50" is an electrical insulator, as is material 20 in all embodiments herein and in all other instances of such material like 50, 50', 50", etc., herein). The upper main surface of the FIG. 7 structure (i.e., the surface that is not visible in FIG. 7) can be identical to the upper surface of the secondary PCB structure shown in FIGS. 1 and 2. Thus the upper surface of the FIG. 7 structure can have contacts 70 and 72 identical to those shown in FIGS. 1 and 2. The FIG. 7 structure can be assembled on a main PCB 20 as shown in FIG. 3 with contact 60" over contact 30, with contact 62" over contact 32, and with gap 164 registered with (e.g., superimposed over) gap 132. Again, ACA 40 may be used between the superimposed structures in this assembly. A full dome switch member like 80 in FIG. 2 can be disposed over the contacts 70 and 72 in the above-described assembly that includes the FIG. 7 structure. The PCB material 50" in this assembly prevents upper outer contact 72 from short-circuiting traces 31 and 33, and these traces are also not short-circuited by contact 62" because of the gap 164 in that contact, which gap is registered with gap 132 as described above.

The above discussion generally describes the contacts on both surfaces of the secondary PCB structure (like 50, 50', or 50") as plated or coated with hard gold. This may not be necessary for the contacts on the lower surface of the secondary PCB structure (i.e., the surface of the secondary PCB that is closer to the main PCB 20). Instead, the contacts (e.g., like 60, 62, 60', 62', 60", and 62") on the lower surface of the secondary PCB structure may have only an immersion gold covering. These contacts are not subject to abrasion by operation of the switch member like 80 or 80'. In addition, like main PCB contacts 30 and 32, they are protected from corrosion by ACA 40.

Figure 8:
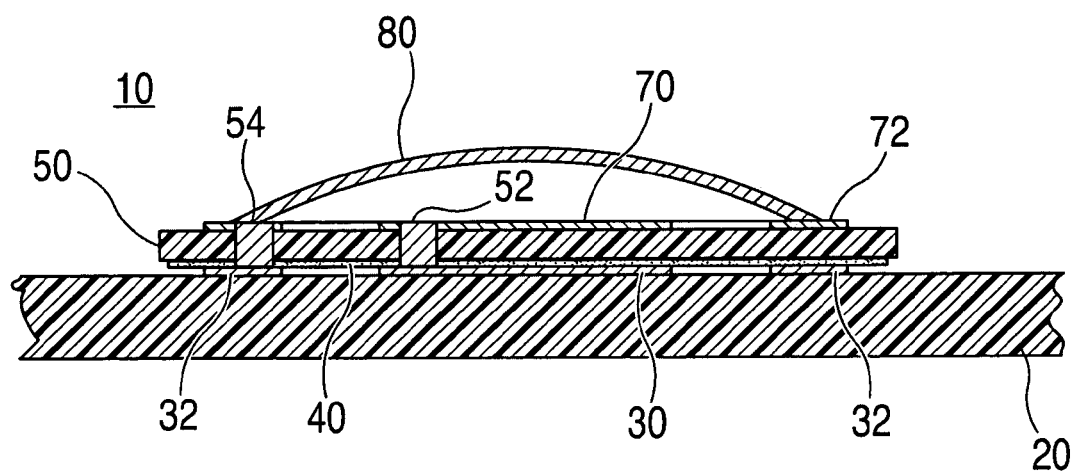
FIG. 8 is a simplified sectional view of an illustrative embodiment of yet another possible structure in accordance with the invention.

In the above-described embodiments the secondary PCB structure is two-sided, i.e., it has contacts on both its upper major surface and its lower major surface. FIG. 8 shows an example of alternative embodiments in which the secondary PCB structure is single-sided, i.e., it has extensive contacts like 70 and 72 only on its upper major surface. Instead of more fully developed contacts on its lower surface, this embodiment relies on the exposed lower ends of vias 52 and 54 for connections to main PCB 20. In particular, ACA 40 between PCBs 20 and 50 electrically connects (1) the exposed lower end of via 52 to contact 30 on PCB 20, and (2) the exposed lower end of via 54 to contact 32 on PCB 20. The secondary PCB structure in embodiments like that shown in FIG. 8 can therefore be single-sided (rather than double-sided as in the earlier-described embodiments).

FIGS. 3-7 illustrate techniques that can be used to make main PCB structure 20 single-sided, i.e., with all circuit traces 31 and 33 associated with switch 10 on only one of the two main surfaces of PCB 20. In the illustrative embodiments shown in those FIGS., all traces 31 and 33 are on the top surface of PCB 20. For completeness, FIG. 9 shows how PCB 20 can alternatively be made double-sided if desired.

Figure 9:
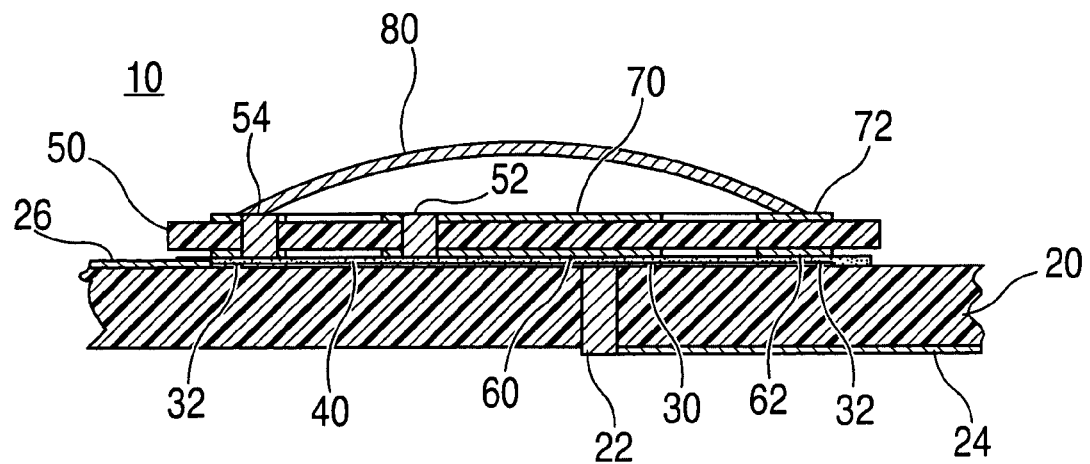
FIG. 9 is a simplified sectional view of an illustrative embodiment of still another possible structure in accordance with the invention.

In FIG. 9 an electrically conductive via 22 is provided through PCB material 20 from contact 30 on the upper surface of that material to the lower surface of that material. The lower end of via 22 can be connected to a circuit trace 24 that extends away from via 22 on the lower main surface of PCB material 20. To complete the FIG. 9 depiction of a double-sided PCB structure, FIG. 9 shows another circuit trace 26 extending away from contact 32 on the upper main surface of PCB material 20.

Figure 10:
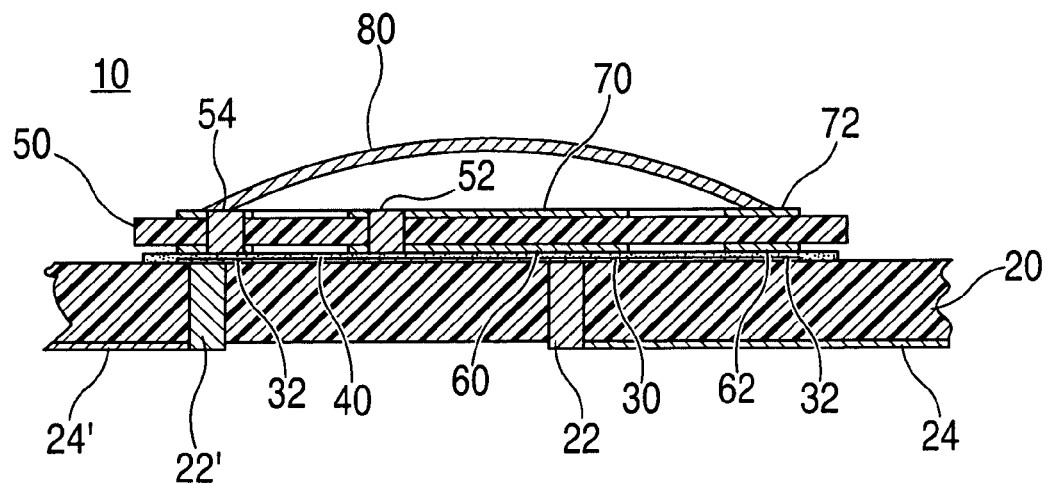
FIG. 10 is a simplified sectional view of an illustrative embodiment of a yet further possible structure in accordance with the invention.

FIG. 10 shows another illustrative embodiment of a single-sided main PCB structure 20 in the vicinity of switch 10. In this case, both circuit traces 24 and 241 for switch 10 are on the lower main surface of PCB sheet 20. Circuit trace 24 is connected to contact 30 in the same way that it is in FIG. 9 (i.e., by a via 22 through PCB material 20). Circuit trace 24' is similarly connected to contact 32 by another via 22' through PCB sheet 20.

To ensure clarity, it is noted here that, as applied to PCB sheets like 20 and 50, terms like "main surface" refer to the relatively large or extensive, primary, planar surfaces of such sheets (as distinct from the relatively small or narrow edges of such a sheet). Thus a PCB sheet like 20 or 50 typically has a "top" main surface and a "bottom" main surface, these two surfaces being on opposite sides of the sheet material and facing away from one another. Terms like "top" and "bottom" are used herein solely for convenience, and not with the intention of limiting what is described to any absolute or fixed orientation relative to any environment in which the described structure may be used.

It will be understood that the foregoing is only illustrative of the principles of the invention, and that various modifications can be made by those skilled in the art without departing from the scope and spirit of the invention. For example, the shapes of various components shown in the drawings are only illustrative, and many of these components can have different shapes if desired. The invention is not limited to dome switches, but rather can be applied to any of several types of switches. For example, FIGS. 4-6 show application of the invention to arch-type switches.

The invention claimed is:

1. A structure comprising:
   a main board including first and second contact areas that are electrically isolated from each other;
   a secondary board including first and second contacts that are electrically isolated from each other and coated with hard gold; and
   anisotropic conductive adhesive for electrically and mechanically coupling the contacts to the respective contact areas and for sealing the contact areas.

2. The structure defined in claim 1 wherein the main board has a first main surface opposite a second main surface, and wherein the main board further includes circuit traces to the contact areas on only the first main surface.

3. The structure defined in claim 1 wherein the main board has a first main surface opposite a second main surface, and wherein the main board further includes a first circuit trace, to the first contact area, on the first main surface of the main board, and a second circuit trace, to the second contact area, on the second main surface of the main board.

4. The structure defined in claim 1 wherein the secondary board has a first main surface opposite a second main surface, and wherein the first and second contacts are on the first main surface of the secondary board, and wherein the secondary board further includes additional contacts on the second main surface of the secondary board.

5. The structure defined in claim 1 wherein the secondary board has a first main surface opposite a second main surface, and wherein the first and second contacts are on the first main surface of the secondary board, and wherein the second main surface of the secondary board is free from contacts.

6. The structure defined in claim 4 wherein only the first and second contacts, and not the additional contacts, are coated with hard gold.

7. The structure defined in claim 1 further comprising:
a switch member coupled to the secondary board for selectively making an electrical connection between the first and second contacts.

8. A printed circuit board ("PCB") structure comprising:
a main PCB structure having a first main surface opposite a second main surface, wherein the first main surface of the main PCB structure has electrical contact areas;
a secondary PCB structure having a first main surface opposite a second main surface, wherein first and second electrically connected electrical contacts are disposed, respectively, on the first and second main surfaces of the secondary PCB structure; and
anisotropic conductive adhesive ("ACA") for physically and electrically connecting the second contact to one of the contact areas.

9. The structure defined in claim 8 wherein the contact area has an immersion gold surface.

10. The structure defined in claim 9 wherein the ACA substantially covers the immersion gold.

11. The structure defined in claim 8 wherein the first contact is plated with hard gold.

12. The structure defined in claim 8 wherein the first and second contacts are electrically connected by means of a via through the secondary PCB structure.

13. The structure defined in claim 8 wherein the first contact contacts an outer peripheral portion of a metal dome of a dome switch.

14. The structure defined in claim 13 wherein the secondary PCB structure further includes third and fourth electrically connected electrical contacts disposed, respectively, on the first and second main surfaces of the secondary PCB structure, the third and fourth contacts being spaced from the first and second contacts, and wherein the third contact is disposed under a normally upwardly arching central portion of the dome.

15. The structure defined in claim 14 wherein the third contact is plated with hard gold.

16. The structure defined in claim 14 wherein the third and fourth contacts are electrically connected by means of a via through the secondary PCB structure.

17. The structure defined in claim 14 wherein the main PCB structure further includes a second electrical contact area that is spaced from the earlier-mentioned contact area and that is physically and electrically connected to the fourth contact by ACA.

18. The structure defined in claim 17 wherein the second contact area has an immersion gold surface.

19. The structure defined in claim 18 wherein the immersion gold surface on the second contact area is substantially covered by ACA.

20. The structure defined in claim 17 wherein the first contact has a closed ring shape which concentrically contacts an entire outer peripheral portion of the dome.

21. The structure defined in claim 20 wherein the third contact is disposed inside the ring shape.

22. The structure defined in claim 17 wherein the second contact is interrupted so that the second contact does not extend all the way around the fourth contact, wherein the contact area is interrupted so that the contact area does not extend all the way around the second contact area, and wherein each of the contact area and the second contact area has a respective conductive trace on said first main surface of the main PCB structure that extends away from the secondary PCB structure, the trace of the second contact area extending away from the secondary PCB structure where the second contact and the contact area are interrupted.

23. A dome switch structure on a printed circuit board ("PCB") comprising:
a main PCB structure having a first main surface opposite a second main surface, wherein the first main surface of the main PCB structure has first and second electrical contact areas;
a secondary PCB structure having a first main surface opposite a second main surface, wherein the first main surface of the secondary PCB structure has first and second electrical contacts and the second main surface of the secondary PCB structure has third and forth electrical contacts, the first and third contacts being electrically connected to one another, and the second and fourth contacts being electrically connected to one another;
anisotropic conductive adhesive ("ACA") for physically and electrically connecting the third and fourth contacts to the first and second contact areas, respectively; and
a metal dome disposed over the first contact and selectively depressable into contact with the first contact, the dome having an outer peripheral base portion that is in contact with the second contact.

24. The structure defined in claim 23 wherein the outer peripheral base portion forms a circular ring, and wherein the second contact also forms a circular ring that is substantially concentric with the circular ring of the base portion, there being circular ring contact between the base portion and the second contact.

25. The structure defined in claim 23 wherein the first and third contacts and the first contact area are substantially aligned with one another parallel to an axis along which the dome is depressable.

26. The structure defined in claim 23 wherein the second and fourth contacts and the second contact area are substantially aligned with one another parallel to an axis along which the dome is depressable.

27. The structure defined in claim 23 wherein each of the first and second contact areas has a respective conductive trace on said one of the main surfaces of the main PCB structure, both of said traces extending away from the secondary PCB structure, the second contact area having an interruption so that it does not extend all the way around the first contact area, and the trace of the first contact area extending away from the secondary PCB structure through the interruption in the second contact area, the fourth contact also having an interruption that registers with the interruption in the second contact area.

* * * * *